United States Patent

Constant

[11] 3,950,635
[45] Apr. 13, 1976

[54] DIGITAL MATCHED FILTER AND CORRELATOR USING RANDOM ACCESS MEMORY

[76] Inventor: James Nickolas Constant, 1603 Danbury Drive, Claremont, Calif. 91711

[22] Filed: June 17, 1974

[21] Appl. No.: 479,872

Related U.S. Application Data

[63] Continuation-in-part of Ser. No. 435,681, Jan. 23, 1974, abandoned.

[52] U.S. Cl. ................................. 235/156; 235/181
[51] Int. Cl.² .......................................... G06F 15/34
[58] Field of Search ........................... 235/156, 181

[56] References Cited
UNITED STATES PATENTS

| | | | |
|---|---|---|---|
| 3,449,553 | 6/1969 | Swan | 235/152 X |
| 3,646,333 | 2/1972 | Pryor, Jr. | 235/181 |
| 3,717,756 | 2/1973 | Stitt | 235/181 |
| 3,748,451 | 7/1973 | Ingwersen | 235/156 |

*Primary Examiner*—David H. Malzahn
*Attorney, Agent, or Firm*—Harris, Kern, Wallen & Tinsley

[57] ABSTRACT

A system for digital signal processing, including a random access memory accessed by counters and used for storing and shifting signals in a time compressor matched filter or correlator.

14 Claims, 3 Drawing Figures

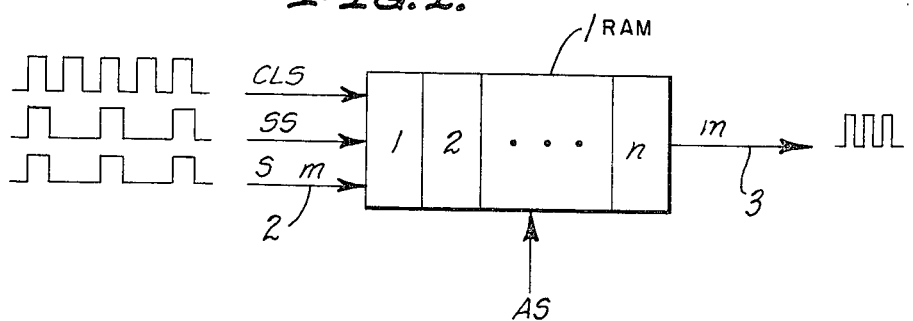
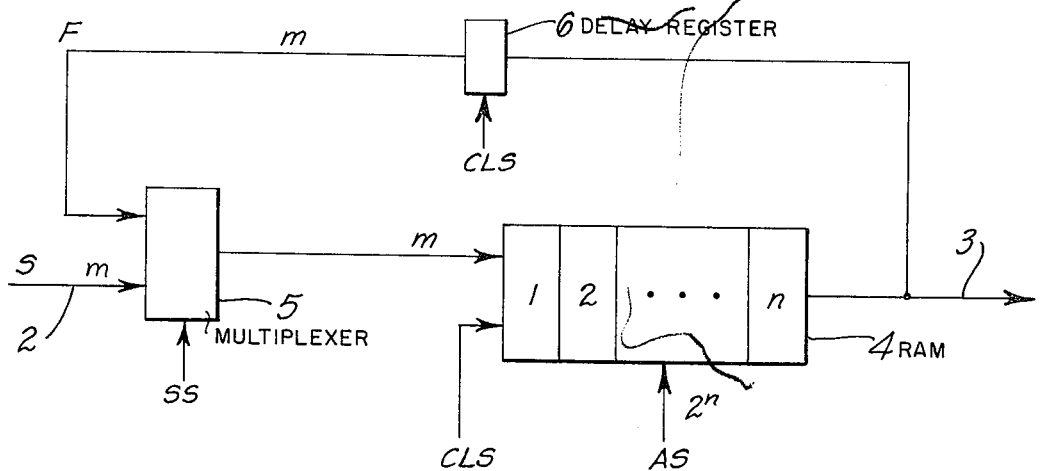
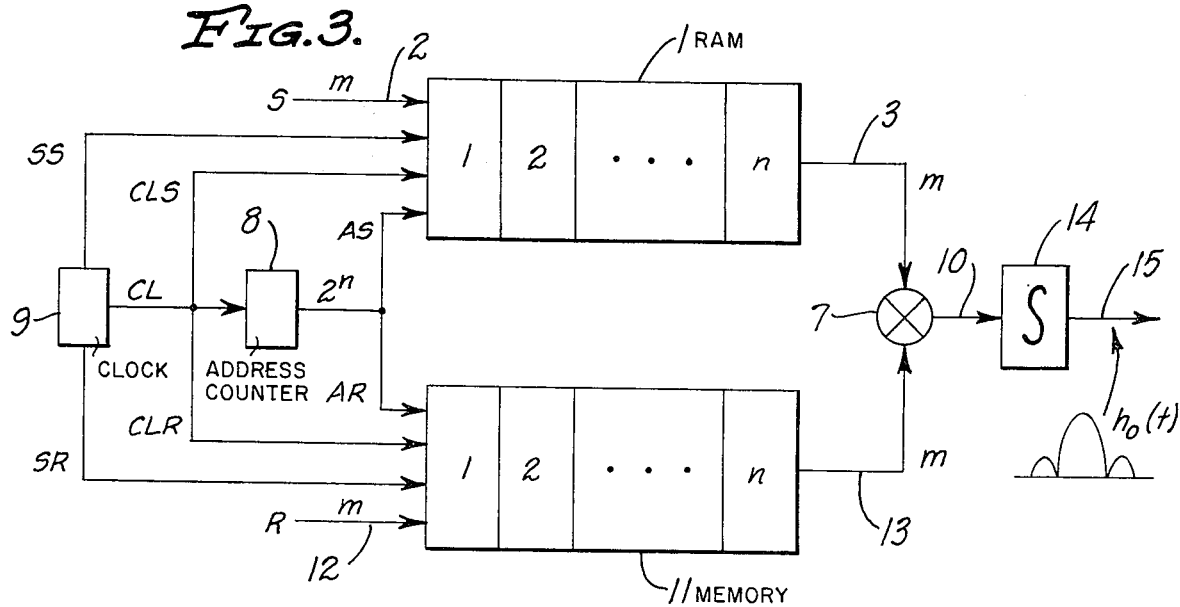

DIGITAL MATCHED FILTER AND CORRELATOR USING RANDOM ACCESS MEMORY

CROSS-REFERENCE TO RELATED APPLICATION

This application is a continuation-in-part of my copending application Ser. No. 435,681, filed Jan. 23, 1974, now abandoned.

BACKGROUND OF THE INVENTION

The present invention relates to signal processing using time compressors, matched filters and correlators and more particularly to digital signal processing in which the signals are represented by a series of coded digits, for example digits found at the output of an analog-to-digital converter.

The linear and bilinear operations most needed for signal processing are: matched filtering, crosscorrelation, and the discrete Fourier transform. These transforms represent an excessive computational load for a general purpose computer and a heavy load even for a digital computer structured for signal processing. For example, a straight-forward linear transformation in a computer that takes a sequence of N data points into a sequence of N transform points may be regarded as a multiplication by a vector $N^2$ matrix. A direct implementation that uses a single multiplier requires $N^2$ multiplication times and $N^2$ words of storage. The Fast Fourier Transform (FFT) offers some advantage in that it requires a number of multiplications proportional to $Nlog_2N$.

A number of transform implementations are known in the art that have a simple serial access data flow and a computation time proportional to N. These include the discrete Fourier transform (DFT), and transforms implemented using transversal filters as discussed in the paper by H. J. Whitehouse et at., "High Speed Serial Access Linear Transform Implementations", Naval Undersea Center, San Diego, CA 92132, January 1973. In general, apparatus in the prior art fall into two broad categories: those employing acoustic and nonacoustic means. Included in the former category are sonic, magnetostrictive, acoustic surface wave, and optacoustic filters while the latter category comprises charge coupled devices and binary shift registers. Acoustic filters have been described in the paper by W. D. Squire et al., "Linear Signal Processing and Ultrasonic Transversal Filters" appearing in the November, 1969, issue of IEEE Transactions on Microwave Theory and Techniques while nonacoustic filters have been described in the paper by G. W. Byram et al., "Signal Processing Device Technology" appearing in the Proceedings of the NATO Advanced Study Institute on Signal Processing held at the University of Technology, Loughborough, U.K. on Aug. 21 through Sept. 1, 1972.

As a rule, if interruptions of the processing are infrequent then acoustic filters are preferred since they offer large storage capacity, convenient tapping of delay lines, and low power dissipation. When short duration interruptions of the signal processing may occur then charge coupled devices (CCD) with their controllable clock rates offer the advantages of small size, offset only by charge transfer inefficiency and temperature sensitivity. When frequent processing interrupts are required, digital implementations in the form of shift registers are indicated. The rapid development of solid state technology however favors digital devices and these by far have now become available commercially.

Digital implementations in the present art have been obtained in the form of shift registers and these are described in the paper by J. J. Buie and D. R. Brewer, "A Large Scale Integrated Correlator" appearing in the October, 1972 issue of IEEE Journal of Solid State Circuits, SC–7. Such devices can be assembled from conventional medium scale integrated circuit logic or can be designed in large scale integrated (LSI) form. Thus, the digital implementation of a time compressor matched filter and correlator requires the high speed storage and readout of data as provided by a shift register. However, shift registers are limited in length and speed, and many similar devices are needed if much data must be stored. Metal-oxide substrate (MOS) registers, while providing high density, require extra power supplies and are slow speed when used as bipolar shift registers.

In many signal processing applications, the signals must be compressed in time. This is accomplished in the prior art by storing signals in a delay line and then retrieving them at a rate which is greater than the rate of storage, as explained in the article by Squire. Of particular interest is the delay line time compressor (DELTIC) which recirculates signals in a number of recirculations. The recirculation requires less length of delay line and therefore is a more efficient system.

In general, the prior digital art using shift registers utilize 2N words of storage and employ N multipliers for performing the correlation of signals. While the system of the present invention may also utilize 2N words of storage, its implementation of a digital DELTIC loop requires only a one word multiplier and in this manner provides new and improved time compressors, matched filters, and correlators while significantly decreasing the weight, size, power consumption, and cost for such devices.

From the discussion above it is clear that in the past, the digital implementation of a time compressor matched filter and correlator has been accomplished using shift registers in the memory element and, for all practical purposes, has not been successful for increasing the capacity and speed of operation for such devices beyond a certain limit determined by the technology of shift registers. Furthermore, the present art of digital implementations falls short when the size and cost of shift registers are considered in devices requiring high data throughputs.

It is the purpose of the present invention to produce a time compressor digital matched filter and correlator capable of exceeding the practical capacity and speed of present digital devices by at least one order of magnitude, at reduced size and cost.

SUMMARY OF THE INVENTION

This invention provides both apparatus and method for the digital implementation of time compressors, matched filters and correlators. A random access memory (RAM) accessed sequentially by a counter is utilized to perform the function of a delay line in a preferred configuration.

The general purpose of this invention is to provide small-size low-cost apparatus for the digital implementation of high-capacity high-speed time compressors, matched filters and correlators. Utilizing the system of the present invention, the digital processing of signals may be accomplished efficiently and economically in real time.

Particular objectives of the invention are to provide a number of configurations of the system preferably using a RAM in a DELTIC loop circuit and thereby to provide new and improved time compressor matched filters and correlators.

BRIEF DESCRIPTION OF THE DRAWINGS

FIG. 1 is a modified DELTIC circuit loop utilized to compress signals in time.

FIG. 2 is a more detailed block diagram of FIG. 1.

FIG. 3 is a block diagram of the system of the present invention in a circuit configuration of a matched filter and correlator.

DESCRIPTION OF THE PREFERRED EMBODIMENTS

Referring to FIG. 1, a modified DELTIC circuit loop 1 is utilized to compress signals S in time under the control of clock CLS, sampling SS, and address signals AS. A signal S appears on $m$ lines at input 2 and is compressed in time appearing on $m$ lines at output 3. The modified DELTIC loop 1 is shown in FIG. 2 in more detail. The modification consists of replacing the computer type acoustic delay line memory normally associated with a conventional DELTIC loop by a random access memory (RAM) 4. In the present disclosure I will refer to the modified DELTIC loop as a DELTIC RAM, DELTIC ROM, and so forth to better indicate the present apparatus over the conventional art. The conventional DELTIC loop is described in the paper by M. Rosenbloom, "Using Time Compression Techniques in Digital Correlation" appearing in the Mar. 10, 1961 issue of Electronics and in the paper by V. C. Anderson, "The Deltic Correlator" appearing in Technical Memo 37, Acoustic Research Laboratory, Harvard University, Cambridge, Mass., January, 1965. FIG. 3 illustrates the use of two such modified DELTIC loops implementing the system of the present invention in a preferable configuration. While 1 and 11 in FIG. 3 preferably may be in the form of the modified DELTIC loop (DELTIC RAM) of FIG. 1 it should be understood that this is not essential to the operation of the present invention. In general, 1 and 11 in FIG. 3 may be in the form of any one of a number of memories, for example, RAMs, PROMs, ROMs and so forth.

Referring to FIG. 2, an analog signal which has, for example, been previously digitized to $m$ level, appears on $m$ lines, where $m = 1, 2, \ldots$, as signal S at 2, is gated through multiplexer 5 to RAM 4. Thus multiplexer 5 when commanded by sampling signal SS inserts signal S into RAM 4 which normally receives feedback signal F on each clock signal CLS. It will be recognized that the procedure of FIG. 2 follows the operation of a conventional DELTIC loop in which RAM 4 plays the role of a delay line. Typically, for certain selections of RAM 4 in the present invention, when clock CLS is LOW, write enable lines in RAM 4 are enabled and the signal S in the form of an $m$ bit word is written into the selected location of RAM 4. When the clock CLS goes HIGH, an address counter increments selecting the next address AS which appears on $2^n$ lines. The $m$ line outputs at 3 are fed back to the inputs of RAM 4 as feedback signal F through single word delay register 6 and multiplexer 5 which inhibits F only when signal S is being sampled. The signal which appears at the output 3 of RAM 4 is a compressed replica of signal S. Reference signal R may also be compressed in time in a similar fashion.

Referring to FIG. 3, a first random access memory 1 is used to store signals S in time while a second random access 11 is used to store reference signals R in time. Random access memory 1 is in the form of a RAM or DELTIC RAM while random access memory 11 may be in any one of a number of forms including a serial-in serial-out shift register, charge coupled device (CCD), random access memory (RAM) or DELTIC loop circuit, a read only memory (ROM), programmable read only memory (PROM), or simply a set of bipolar signals applied to one input of multiplier 7, the other input to multiplier 7 being provided by random access memory 1. Thus random access memory 1 and 11 may be any one of a number of types, the exact type being determined by the application. Random access memory 1 is organized $n$ words by $m$ bits and is arranged to operate as a serial-in serial-out shift register. An example of the use of a RAM as a shift register is given in the brief article by J. Springer, "High-speed shift registers use TTL RAMs and counters to do all the shifting" appearing at page 146 of the Sept. 1, 1973 issue of Electronics Design. In the following, both random access memory 1 and 11 will be assumed to be DELTIC RAMs although their exact specification will be determined by the application. With this assumption, both DELTIC RAMs 1 and 11 are accessed by address counter 8. On each clock CL, address counter 8 shifts one place thus selecting a different word in DELTIC RAMs 1 and 11. The address cycle is completed after $n$ shifts and is under control of the computer or clock 9 which also provides timing and sampling by way of clock signals CLS, CLR and sampling signals SS, SR. An analog signal which has previously been digitized to $m$ level at the rate SS appears on $m$ lines as signals S at 2, while a second signal appears as reference signal R at 12. The clock, sampling, and address signals CLS, CLR, SS, SR, AS AR are determined by the application. Clock signals CLS and CLR are determined by the system capacity and speed. Sampling signals SS and SR are some frequency fraction of the clock rate CL and generally are determined by sampling requirements for the signal S and reference signal R. Finally, address signals AS and AR are determined by the size of RAMs in DELTIC RAMs 1 and 11.

Using some RAMs, for example the SN 7489 (Texas Instruments), AM27503 Advanced Micro Devices, 310IT (Intel), μA9103 (Fairchild), NA7599 (National) and so forth, the operation proceeds in a manner such that when clock CL is LOW, write enable lines in the RAMs are enabled by clock signal CLS and the digitized signal S is written into the selected locations of DELTIC RAM 1. When the clock CL goes HIGH, address counter 8 increments selecting the next address while DELTIC RAM 1 goes into the READ mode. Other RAMs, for example the Signetics Model 82S21, will accept signals S while their contents are being read. Thus, on each shift of address counter 8, the information stored in DELTIC RAM 1 is provided as an input to multiplier 7 which may be in the form of an exclusive OR gate which then ORs the signal output with information provided by DELTIC RAM 11 to produce signal coincidence or anti-coincidence for that place. Unlike the corresponding shift register implementation as dual tapped delay lines in the prior art, the preferable system of the present invention implements the digital matched filter and correlator as a dual DELTIC loop circuit. However, while the invention in a preferable configuration employs a DELTIC RAM, it will operate equally well using a RAM. It will be recognized by those familiar with the art that the present invention implements the digital matched filter and correlator using RAMs in the role of delay registers. The theory and properties of conventional implementations in the form of transversal filters have been described in the reference by Squire et al. while the digital implementation for matched filters and correlators using serial-in parallel-out shift registers as transversal filters are described in the references by Whitehead, Byram, Buie and Brewer. In summary, the present invention implements digital matched filters and correlators using RAMs.

Once loaded into their respective DELTIC RAMs 1 and 11, signals S and R may be exclusively ORed in multiplier 7 at the update clock rate CL to produce the correlation product signal at output 10. The product signal at 10 may be integrated in integrator 14 whose output at 15 represents the correlation $h_o(t)$ of signals S and R. It should be understood in FIG. 3 that the operation of DELTIC RAMs 1 and 11 is not necessarily identical, the difference being that while DELTIC RAM 1 continuously updates signal S by delaying signals in single word delay register 6 and multiplexer 5, no such delaying and multiplexing are required in DELTIC RAM 11 when this circuit is being used as a fixed reference. Thus, the single word delay register 6 and multiplexer 5, required for operation of DELTIC RAM 1, are not needed once reference signal R has been loaded into DELTIC RAM 11 for use as a fixed reference.

It should be understood that address codes AS and AR are applied to DELTIC RAMs 1 and 11 on $2^n$ lines. It should also be understood that signal S and reference signal R are applied on $m$ lines to their respective DELTIC RAMs 1 and 11 the outputs of which are also carried on $m$ lines.

The system of the present invention can be operated as either a fixed or programmable matched filter or correlator. When used as a matched filter, the desired reference signal R is loaded into random access memory 11 which may be in the form of a DELTIC or non-DELTIC ROM, PROM, or RAM and left undisturbed for the duration of the required processing. However, the system of the present invention is particularly suited for applications in which reference signal R must frequently be changed. The change is made by loading a new reference signal R into random access memory 11 and as before, introducing the signal S to be correlated into DELTIC RAM 1, the entire operation being under control of clock 9. In this mode of its operation the present invention constitutes a programmable matched filter. A correlator results when DELTIC RAMs 1 and 11 are operated independently, their circuits and operations being identical and signals S and R being introduced either synchronously or asynchronously into their respective channels.

In mathematical terms, the process of cross correlation is described by the equation:

$$h_o(t) = \int S(\tau)R(t+\tau)d\tau$$

where
$t$ is the time shift between signals.

The hardware implementation of this equation in the present invention is shown in the block diagram of FIG. 3. Two $m$ bit words representing signals S and R are serially shifted into random access memory 1 and 11. The two words are serially compared $m$ bit word - for $m$ bit word by exclusive OR gate 7 which provides the required function of multiplication. The output 10 of exclusive OR gate 7 may, in some application, be summed in an integrator 14 to produce the correlation function of signals S and R at 15. The output 10 however is available at the high speed compressed signal rate in some applications, thereby permitting simultaneous display with variations of the input signal S.

In a matched filter $R(\tau) = E(-\tau)$. Thus, the matched filter forms the cross correlation between the input signal S and the estimate signal E which is an estimate of S. If the input signal S were the same as the estimate signal E, the output $h_o(t)$ would be the autocorrelation function.

In practical terms, the difference between a matched filter and a correlator is in the way reference signal R is implemented for processing signal S. If R is built into the system, it becomes a matched filter while if R is applied continuously to the system, it becomes a correlator.

Any one of the many possible modes of operation suggested by FIG. 3 produces the correlated signal at 15. When the address counter 8 has gone through its full $n$ word count cycle, the same RAM 1 locations will be addressed again, and the data stored during the last access of that location will be read out. While conventional digital matched filters and correlators employ $l \times n$ shift registers, the system of the present invention utilizes the $m \times n$ memory system of a RAM to obtain further capacity, speed, size, and cost improvements over the present art. As is the case with shift registers, RAMs also can be assembled from conventional medium scale integrated circuit logic or can be designed in LSI form. Both types of devices are limited in size and many units are needed if large word and bit capacities are to be achieved. However, unlike a shift register, the "length" of a RAM is less speed dependent while its content is under the control of clock 9 signal CL, sampling SS, and address signals AS, thus offering a variety of combinations for these parameters. On a per bit basis, the size and cost of a RAM is considerably less than that for a shift register. For example, the SN 7489 (Texas Instruments) 64 bit TTL RAM costs 25% more than the SN 74164 (Texas Instruments) 8 bit TTL shift register. Both devices have the same size so the conclusion is that eight times more capacity can be achieved by a typical commercially available RAM over a shift register at only slight increase in cost. On the other hand present RAM speeds at 100 MHz exceed shift register speeds by a factor 10. It is to be expected therefore that digital matched filters and correlators using the system of the present invention will increase both the capacity and speed of such devices while decreasing their size and cost by an order of magnitude. This then is the objective of the present invention.

The distinguishing feature in the present invention is the preferred use of a RAM (in a DELTIC or nonDELTIC circuit) to perform the function of a delay line for the implementation of a matched filter or correlator. Thus while a clock 9 may be used to provide sampling signals SS, SR and clock signals CLS, CLR in the prior art, the use of a RAM in the present invention also requires the use of an address counter 8 for addressing memories 1 and 11. Under control of the clock signal CL, address counter 8 steps through address sequence 1, 2, . . . , n. At each location the clock signal CLS or CLR applied to a memory moves signals, first, from the memory to its output and, second, from its input to the location in the memory being addressed. The clock signal therefore controls accessing to and from the memory and, through address counter 8 addressing the memory. It also controls sampling signals SS and SR which are used to sample or gate signals from the outside world into the system.

As shown in FIG. 3, the input signals which have been digitized to $m$ bits are inputted to a given memory on $m$ lines and outputted on $m$ lines. The two $m$ line outputs are multiplied in multiplier 7 which in practical terms assumes the form of $m$ exclusive OR gates. The output of multiplier 7 is carried on $m$ lines, and may be summed or, since it occurs at high speed, may be displayed directly. Thus on the positive portion of the clock cycle, the $m$ bit signal contained in the memory is placed on the multiplier 7 as an $m$ bit word while on the negative cycle, new information at the memory input is written into the memory. "Accessing" the memory calls for first, moving its present content to its output and, second, moving new information into the just vacated location of that particular address in the memory. The input signal S occurs at the sampling rate SS while the clock is at the faster rate CLS. All timing signals SS, SR, CLS, CLR, AS, AR are under control of clock 9, their exact selection being determined by the application. The clock and its signal CL therefore controls sampling, addressing and accessing. "Timing" is the sequence which is used in a particular application to perform these tasks.

In many applications it is desirable to combine the central control afforded by a general purpose computer with the efficiency and economy provided by special purpose signal processing devices. Such applications might require operations which include time compression for first signal analysis matched filtering for echo ranging or for coherent communications systems, cross correlation for interferometric analysis or for signal identification, spectrum analysis for passive detection and classification, and general linear transformations on data vectors. Matched filters and correlators are special purpose signal processing devices which perform linear and bilinear operations at rates in excess of the capabilities of large general purpose computers. Their applications include and are well suited for the detection of signals (matched filter), the correlation of signals (correlator), and the spectral analysis (spectral correlation) of signals. Options for the implementation of matched filters and correlators include both analog and digital means, their full potential being limited by the technical efficiency and economic availability of practical hardware. Digital means in particular offer outstanding practical implementations in certain applications and have found use in such sophisticated signal processing tasks as bit synchronization, bit detection, error correction, coding, pulse compression, synthetic aperture processing, and other applications. In particular, the system of the present invention is expected to make dramatic reductions in the speed, complexity, and cost of detecting signals buried in noise and in the substantial reduction in the amount of computer power in applications involving radar, sonar, and the communications areas of television and mobile radio.

Although a particular configuration of a digital matched filter and correlator has been described, it should be understood that the scope of the invention should not be considered to be limited by the particular embodiment of the invention shown by way of illustration but rather by the appendant claims.

I claim:

1. In a system for the digital implementation of matched filters and correlators, the combination of:
    a first digital delay means having a first random access memory for storing first signals, said first memory having storage locations for $n$ words;
    a second digital delay means having a second memory for storing second signals, said second memory having storage locations for $n$ words;
    an address counter connected to said memories for addressing $n$ corresponding storage locations of said first and second memories in a sampling interval providing $n$ pairs of outputs in sequence;
    clock means connected to said memories and to said address counter for controlling timing operations of said first and second memories and of said address counter, including means for shifting at least said first signals in said first memory after each sampling interval;
    multiplier means having as its input the $n$ pairs of outputs of said first and said second memories and providing at its output the serial word by word product of said first and said second signals; and
    integrator means having said multiplier means output as an input for integrating the product over a number of sampling intervals.

2. The system of claim 1 wherein said second memory is a random access memory.

3. The system of claim 1 wherein said second memory is a read only memory.

4. The system of claim 1 wherein said second memory is a programmable read only memory.

5. The system of claim 1 wherein said second memory includes means for generating a set of bipolar signals.

6. The system of claim 1 wherein said second memory is a DELTIC circuit.

7. The system of claim 1 wherein said multiplier means includes a set of $m$ multipliers for the serial word by word multiplication of said first and said second signals.

8. The system of claim 1 wherein said first memory is a DELTIC circuit.

9. The system of claim 1 wherein said clock means includes means for shifting said second signals in said second memory after each sampling interval.

10. In a system for the digital implementation of matched filters and correlators, the combination of:
    a first digital delay means having a first random access memory for storing first signals, said first memory having storage locations for $n$ words;
    a second digital delay means having a second memory in the form of a shift register for storing second signals, with storage locations for $n$ words;
    an address counter connected to said first memory for addressing $n$ corresponding storage locations of said first memory in a sampling interval providing $n$ outputs in sequence;
    clock means connected to said memories and to said address counter for controlling timing operations of said first and second memories and of said address counter, including means for shifting at least said first signals in said first memory after each sampling interval;

multiplier means having as its input the $n$ pairs of outputs of said first and said second memories and providing at its output the serial word by word product of said first and said second signals; and integrator means having said multiplier means output as an input for integrating the product over a number of sampling intervals.

11. A method for the digital implementation of matched filters and correlators using all hardwired components and including the steps of:

storing first signals in a first random access memory having storage locations for $n$ words;

storing second signals in a second memory having storage locations for $n$ words;

addressing corresponding storage locations of the first random access memory and the second memory in a sampling interval and providing $n$ pairs of outputs in sequence;

serially multiplying the $n$ pairs of outputs from said first and second memories to produce the word by word product of said signals;

shifting at least the first signals in the first memory after each sampling interval, and integrating the products of multiplications over a number of sampling intervals producing the correlation of the first and second signals.

12. The method of claim 11 wherein the second signals are stored in a second memory comprising a DELTIC circuit.

13. The method of claim 11 wherein the first signals are stored in a first random access memory comprising a DELTIC circuit.

14. The method of claim 11 including shifting the second signals in the second memory after each sampling interval.

* * * * *

UNITED STATES PATENT AND TRADEMARK OFFICE
CERTIFICATE OF CORRECTION

PATENT NO. : 3,950,635
DATED : April 13, 1976
INVENTOR(S) : James Nickolas Constant It is certified that error appears in the above—identified patent and that said Letters Patent are hereby corrected as shown below:

Column 3, line 63, column 5, line 35, Fig. 2 and Fig. 3, change "$2^n$" to --$\log_2 n$--.

Signed and Sealed this

Third Day of August 1976

[SEAL]

Attest:

RUTH C. MASON
Attesting Officer

C. MARSHALL DANN
Commissioner of Patents and Trademarks